United States Patent [19]

Allman et al.

[11] Patent Number: 4,855,258

[45] Date of Patent: Aug. 8, 1989

[54] NATIVE OXIDE REDUCTION FOR SEALING NITRIDE DEPOSITION

[75] Inventors: Derryl D. J. Allman; Steven S. Lee, both of Colorado Springs, Colo.

[73] Assignee: NCR Corporation, Dayton, Ohio

[21] Appl. No.: 111,377

[22] Filed: Oct. 22, 1987

[51] Int. Cl.$^4$ .................... H01L 21/76; H01L 21/318
[52] U.S. Cl. ........................ 437/241; 148/DIG. 81;
148/DIG. 114; 148/DIG. 118; 357/49; 437/69;
437/238; 437/939; 437/946; 437/978
[58] Field of Search .............. 148/DIG. 27, 81, 106,
148/112, 114, 118, 163; 156/643; 357/49, 54;
437/67, 69, 72, 73, 241, 242, 238, 239, 978, 939, 946

[56] References Cited

U.S. PATENT DOCUMENTS

| | | | |
|---|---|---|---|
| 4,277,320 | 7/1981 | Beguwala et al. | 437/242 |
| 4,373,965 | 2/1983 | Smigelski | 357/49 |
| 4,402,997 | 9/1983 | Hogan et al. | 437/242 |
| 4,428,975 | 1/1984 | Dahm et al. | 437/243 |
| 4,435,447 | 3/1984 | Ito et al. | 437/241 |
| 4,472,459 | 9/1984 | Fisher | 437/241 |
| 4,551,910 | 11/1985 | Patterson | 437/242 |
| 4,588,610 | 5/1986 | Yamazaki | 437/241 |
| 4,645,683 | 2/1987 | Gourrier et al. | 156/643 |
| 4,692,344 | 9/1987 | Kaganowicz et al. | 437/241 |
| 4,699,825 | 10/1987 | Sakai et al. | 437/241 |

Primary Examiner—Brian E. Hearn
Assistant Examiner—William Bonch
Attorney, Agent, or Firm—Wilbert Hawk, Jr.; Casimer K. Salys

[57] ABSTRACT

A process for forming a thin sealing layer of silicon nitride directly upon a silicon substrate to minimize bird's beak encroachment. The process employs in situ fabrication whereby the native oxide is removed from the silicon substrate by etching the hydrogen or hydrogen chloride and followed in direct succession, and in the absence of exposure to an oxidizing environment, with the deposition of a silicon nitride layer by LPCVD. Bird's beak encroachment is incrementally reduced by the absence of the native oxide layer as a path for oxygen species movement during the field oxide growth.

9 Claims, 1 Drawing Sheet

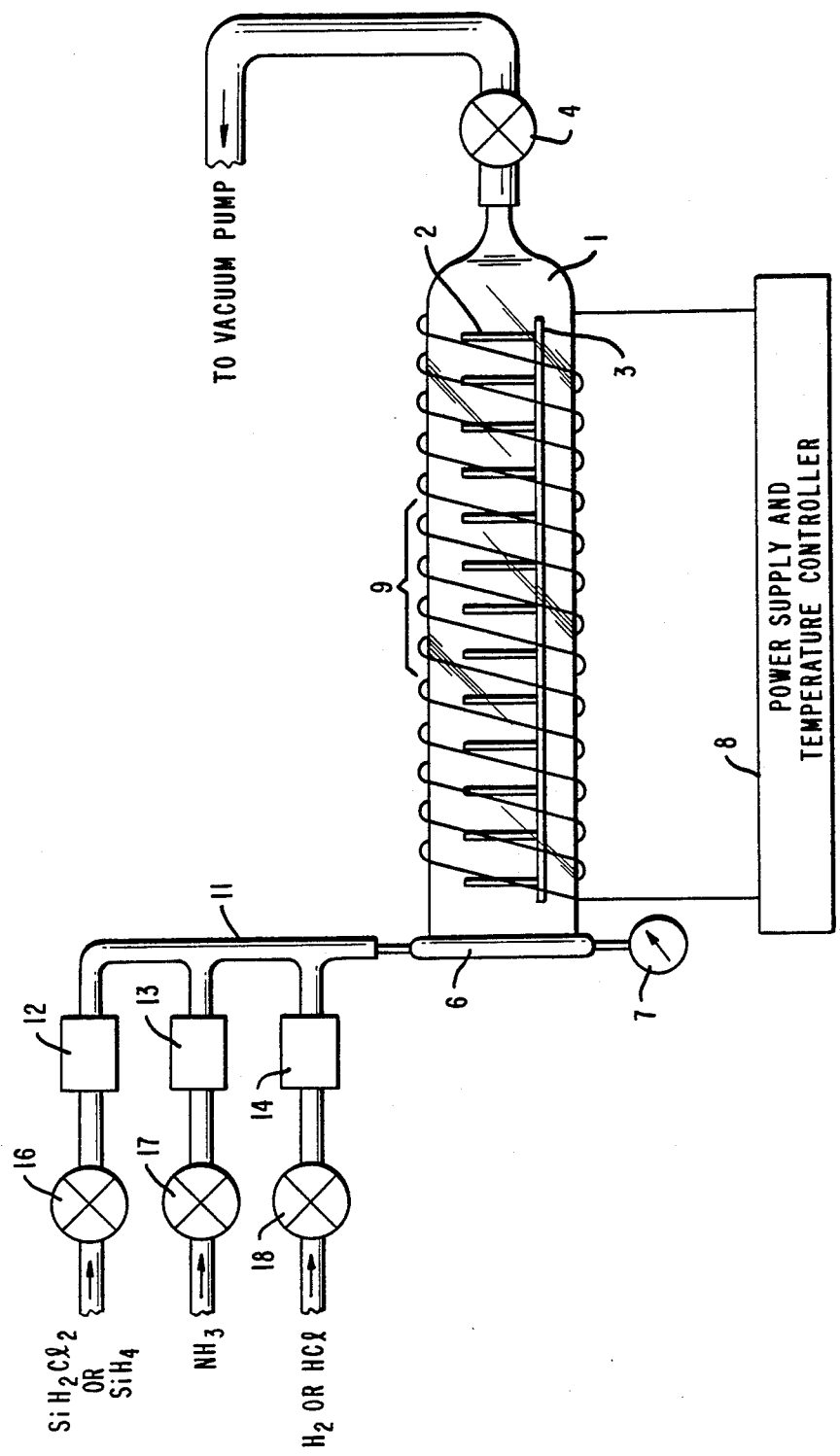

NATIVE OXIDE REDUCTION FOR SEALING NITRIDE DEPOSITION

BACKGROUND OF THE INVENTION

Active regions in a silicon semiconductor substrate are conventionally separated by growing silicon dioxide dielectric in selected regions using the substrate silicon and an oxidizing environment. The active regions are masked with a patterned silicon nitride layer to prevent oxidation. Nevertheless, the silicon dioxide growths extend beneath the edges of the masking silicon nitride layer to form undesired protrusions of silicon dioxide commonly known as the "bird's beak". Investigations directed toward the reduction of the bird's beak have identified that a major contributor to the formation is the thin silicon dioxide pad or buffer layer, which layer is conventionally formed beneath the silicon nitride masking layer to avoid dislocation defect type damage otherwise induced by the thermal coefficient of expansion mismatch between any thick silicon nitride mask and the monocrystalline silicon substrate.

Various techniques for suppressing the lateral movement of oxygen species through the pad layer underneath the silicon nitride mask have been evaluated, with varying degrees of success. For instance, the use rapid thermal nitridation to convert the pad/buffer silicon dioxide (oxide) layer, or merely the native oxide layer, to a graded oxynitride has exhibited relatively good results and is described in co-pending U.S. patent application Ser. No. 07/110,245 (NCR Docket 3967), assigned to the assignee of the present application. Another technique, involving the use of a thin sealing silicon nitride (nitride) layer deposited directly over the native oxide or the nitrided native oxide, was proposed in the article entitled "Selective Oxidation Technologies for High Density MOS" by authors Hui et al., as appeared in the *IEEE Electron Device Letters* of October 1981. Extensions of the sealed interface localized oxidation (SILO) concept first proposed in the article by Hui et al. are developed in U.S. Pat. Nos. 4,472,459 and 4,551,910. The former patent proposes the deposition of the thin nitride layer on the substrate silicon, without the express formation of an intermediate pad/buffer oxide layer. The implications of the native oxide layer are not addressed. A similar absence of appreciation for the effects of the native oxide is apparent in the teachings of the latter identified patent, where the process expressly prescribes the formation of the nitride layer over the native oxide layer.

Sequential processing in the context of semiconductor fabrication is taught in U.S. Pat. No. 4,438,157, wherein there are described processes for in situ deposition of multiple dielectric layers during the formation of nonvolatile memory devices.

There remains a need for further reducing the bird's beak effect during field oxide growth in silicon semiconductor substrates. The importance of eliminating or substantially suppressing the bird's beak protrusion is evidenced by the major resources being expended to evaluate various trench isolation structures and processes as documented in recent patent and technical literature.

SUMMARY OF THE INVENTION

The invention is directed to a silicon semiconductor fabrication process in which a sealing and masking silicon nitride layer is deposited direct after an etch removal of the native silicon dioxide from the substrate surface. The process focuses on in situ fabrication, during the sequence from the native oxide etch to the nitride deposition, to remove and inhibit the new formation of native oxide.

In one preferred form of its practice the invention involves a furnace tube preconditioning of monocrystalline substrate wafers to an elevated temperature and at a reduced pressure as a prelude to providing a flowing hydrogen chloride (HCl) gas ambient suitable to etch and remove all native oxide. Upon terminating the flow of HCl gas, the furnace tube is evacuated to purge etching residues. The flow of dichlorosilane ($SiH_2Cl_2$) and ammonia ($NH_3$) gas then commence at a subatmospheric pressure to chemically deposit silicon nitride directly onto the clean silicon substrate surface. The in situ operation ensures that the thin sealing silicon nitride layer used for masking during the field oxidation does not entrap an oxide or oxynitride composition layer at the silicon surface. Tests have established that the in situ etching and deposition sequence provides a sealing nitride layer which when subjected to field oxide growth results in a further reduction of the bird's beak protrusion.

According to an alternate practice of the invention, the in situ etch of the native oxide is performed at elevated temperature and reduced pressure in a hydrogen ($H_2$) environment, followed in succession by the evacuation and the onset of the nitride deposition previously described.

These and other features of the invention will become more apparent upon considering the detailed embodiments which follow.

BRIEF DESCRIPTION OF THE DRAWING

The FIGRURE schematically illustrates an in situ furnace system suitable to perform an etch of native oxide, a purge operation, and a silicon nitride deposition operation.

DESCRIPTION OF THE PREFERRED EMBODIMENT

Numerous different techniques for forming dielectric between active regions in a silicon semiconductor substrate have been considered and tested. The pervasive goal has been to limit the encroachment of the field oxide dielectric into the active regions, commonly referred to as the bird's beak problem, encountered during the selective oxidation of the monocrystalline silicon substrate while the active regions are covered by a masking silicon nitride layer. Given that the bird's beak area subtracts directly from the active area useable for device fabrication, there continues to exist a broadly based desire to further reducing the magnitude of the bird's beak protrusion even in relatively small amounts. On the other hand, those who practice in the technology recognizing that the fabrication refinements which further reduce the bird's beak effect should not materially degrade the characteristics of the devices fabricated in the active regions, nor have a negative impact on fabrication times or costs.

The sealed interface localized oxidation (SILO) process described in the aforementioned article represented a technology which appeared to significantly reduce the bird's beak length in contrast with the classic selective oxidation of silicon process. The present process recognizes the advantage of the SILO process and extends the benefits by further reducing the bird's beak length.

The process is practiced in the context of the apparatus shown in the drawing, where the quartz tube furnace 1, for example, an LPCVD nitride furnace manufactured by Thermco Corporation, is loaded with a semiconductor substrate wafers 2 using boat 3. The tube furnace 1 is sealed by cover 6 to limit access at one end through outlet valve 4, leading by line to a vacuum pump, and accessed at the opposite end through manifold 11 to various sources of gases. The tube furnace pressure is sensed by detector 7 which may if desired regulate the flow rate to the vacuum pump. Heat is provided and regulated by power supply and temperature control 8 operable in conjunction with RF heating coil 9. The gases furnished to tube furnace 1 are mixed in manifold 11. The flow rates of the individual gases, dichlorosilane or silicon, ammonia, and hydrogen or hydrogen chloride, into mixing manifold 11 are controlled by respective electronic mass flow controllers 12, 13 and 14. Valves 16, 17 and 18 fixedly disconnect the respective sources of gas from the mixing manifold 11 and tube furnace 1.

According to one practice of an embodying fabrication sequence, the chamber within tube furnace 1 is first preconditioned by heat from RF coil 9 and evacuation through valve 4 for approximately fifteen minutes. Thereafter, valve 18 is enabled to provide a flow of hydrogen chloride gas through manifold 11 into tube furnace 1. The chamber pressure is stabilized at approximately 100 mTorr by adjusting the evacuation rate of the vacuum pump. During this time the tube furnace chamber temperature is maintained at approximately 800°-900° C. and the flow rate of hydrogen chloride is held to approximately 25 standard cubic centimeters per minute (sccm). These conditions are thereafter maintained for approximately fifteen minutes to completely remove by etching the 0.5-3 nanometers of native silicon dioxide typically present on monocrystalline silicon wafers 2 exposed to ambient oxidation conditions.

At the conclusion of the fifteen minute etch time, valve 18 is closed and the chamber within tube furnace 1 is evacuated to purge residuals of hydrogen chloride gas and the etch reactants, while maintaining the furnace temperature and seal integrity. This evacuation or purge cycle is continued for a period of approximately fifteen minutes.

Valves 16 and 17 are then opened to permit the flow of ammonia and either dichlorosilane or silane gas into mixing manifold 11, and eventually into the chamber of furnace 1 where wafers 2 reside. The flow of dichlorosilane or silane is regulated by controller 12 to approximately 20 sccm while the flow of ammonia through controller 13 is regulated to approximately 70 sccm. The evacuation rate is adjusted to establish and maintain a chamber pressure of approximately 700 mTorr while retaining the formerly utilized tube furnace chamber temperature of approximately 800°-900° C. The mixture of dichlorosilane of silane with ammonia at the low pressure and elevated high temperature within tube furnace 1 initiates a chemical reaction which deposits silicon nitride onto wafers 2, which wafers 2 were immediately therebefore etched clean of all silicon dioxide.

Under the conditions defined, the nitride is deposited onto the substrate wafers at a rate of approximately two nanometers per minute. Preferably, the low pressure chemical vapor deposition (LPCVD) of the nitride layer is continued for approximately six minutes to form directly onto the clean monocrystalline silicon substrate of wafers 2 a relatively thin sealing silicon nitride layer of approximately 12 nanometers.

Note that the transition from the etch which removes the native oxide to the deposition which forms the sealing silicon nitride layer is undertaken in direct succession, without exposing the wafers to sources of either ambient or chamber oxygen. Consequently, the in situ etching and deposition ensures an ideal junction and bond between the monocrystalline silicon substrate and the masking silicon nitride layer, and the complete elimination of silicon dioxide or oxynitride paths for the movement of oxygen species beneath the nitride layer during field oxide growth.

An alternate embodiment utilizes hydrogen gas in lieu of hydrogen chloride to perform the native silicon dioxide etch operation. According to that practice, the preconditioning evacuation and heating operations are followed by an enablement of flow is enabled through valve 18 to provide hydrogen gas flow at a rate of approximately 25 sccm, while regulating evacuation to maintain a pressure of approximately 100 mTorr and controlling furnace temperature to approximately 800°-900° C. The hydrogen based oxide etch conditions are maintained for a period of approximately fifteen minutes before initiating the next step of a fifteen minute evacuation in preparation for silicon nitride deposition. Again, the in situ transition between the native oxide etch and the silicon nitride deposition eliminates paths for oxygen species during the ensuing field oxide growth operation.

The effectiveness of the seal is best evaluated by considering the relative bird's beak encroachment when growing comparable 700 nanometers layers of field oxide. The encroachment or bird's beak length is defined as the distance from the edge of the masking nitride to the furthest point which the field oxide penetrates under the sealing nitride layer. SILO techniques commonly yield encroachment lengths ranging from 0.45-0.6 micrometers along any edge for the specified 700 nanometers of field oxide. In contrast, in situ sealing of the silicon surface according to the practice of the present invention nominally yields encroachment lengths of 0.25-0.35 micrometers when using a sealing silicon nitride layer of approximately 13 nanometers combined with 40 nanometers of low temperature deposited oxide and either 100 or 140 nanometers of LPCVD silicon nitride. Tests have shown that even further reductions of encroachment can be obtained, to the range of 0.15-0.25 micrometers, by using a combination of such sealing silicon nitride layer at approximately 13 nanometers, a low temperature oxide layer of approximately 30 nanometers and a final nitride mask layer of approximately 100 nanometers.

Cross sectional analyses of the structures also confirm that the transition between the grown field oxide and the active region is relatively gentle, to facilitate step coverage of subsequently formed and patterned conductive layers.

We claim:

1. A semiconductor fabrication process for depositing a sealing layer useable during field oxide growth on a silicon substrate surface, comprising the steps of:
    conditioning the substrate in a chamber at reduced pressure and elevated temperature;

removing the native silicon dioxide from the silicon substrate by initiating a flow of silicon dioxide etchant gas through the chamber while maintaining a first subatmospheric pressure and an elevated temperature;

purging the chamber of etching or oxidizing gases by evacuation;

initiating the flow of silicon nitride deposition gases to fill the chamber and raise the pressure to a second subatmospheric level, while maintaining an elevated temperature; and depositing directly upon the silicon substrate a sealed interface masking layer of silicon nitride nominally ranging from ten to twenty nanometers in thickness.

2. The process recited in claim 1, wherein the silicon dioxide etchant gas includes HCl, the first pressure in the chamber is in the range of 100 mTorr, and the elevated temperature is in the range of 800°-900° C.

3. The process recited in claim 2, wherein the silicon nitride deposition gases include silane or dichlorosilane and ammonia, and the second pressure in the chamber is in the range of 700 mTorr.

4. The process recited in claim 1, wherein the silicon dioxide etchant gas includes $H_2$, the first pressure in the chamber is in the range of 100 mTorr, and the elevated temperature is in the range of a 800°-900° C.

5. The process recited in claim 4, wherein the silicon nitride deposition gases include silane or dichlorosilane and ammonia, and the second pressure in the chamber is in the range of 700 mTorr.

6. A process for depositing a thin layer of silicon nitride directly onto a silicon substrate, comprising the steps of:

etching the native silicon dioxide from the silicon substrate using an HCl gas mixture in a chamber maintained at a first subatmospheric pressure and an elevated temperature;

purging the chamber of gas residuals by evacuation; and depositing silicon nitride onto the substrate using silane or dichlorosilane and ammonia in situ and immediately following evacuation while maintaining the chamber at a second subatmospheric pressure and an elevated temperature.

7. The process recited in claim 6, wherein the first subatmospheric pressure is in the range of 100 mTorr and the elevated temperatures is in the range of 800°-900° C.

8. A process for depositing a thin layer of silicon nitride directly onto a silicon substrate, comprising the steps of:

etching the native silicon dioxide from the silicon substrate using an $H_2$ gas mixture in a chamber maintained at a first subatmospheric pressure and an elevated temperature;

purging the chamber of gas residuals by evacuation; and depositing silicon nitride onto the substrate using silane or dichlorosilane and ammonia in situ and immediately following evacuation while maintaining the chamber at a second subatmospheric pressure and an elevated temperature.

9. The process recited in claim 8, wherein the first subatmosphere pressure is in the range of 100 mTorr and the elevated temperatures in the range of 800°-900° C.

* * * * *